United States Patent
Liu et al.

(10) Patent No.: US 10,934,485 B2
(45) Date of Patent: Mar. 2, 2021

(54) ETCHING SOLUTION FOR SELECTIVELY REMOVING SILICON OVER SILICON-GERMANIUM ALLOY FROM A SILICON-GERMANIUM/ SILICON STACK DURING MANUFACTURE OF A SEMICONDUCTOR DEVICE

(71) Applicant: Versum Materials US, LLC, Tempe, AZ (US)

(72) Inventors: Wen Dar Liu, Chupei (TW); Yi-Chia Lee, Chupei (TW); Andrew J. Adamczyk, Auburn, AL (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/109,172

(22) Filed: Aug. 22, 2018

(65) Prior Publication Data
US 2019/0085240 A1 Mar. 21, 2019

Related U.S. Application Data

(60) Provisional application No. 62/550,491, filed on Aug. 25, 2017.

(51) Int. Cl.
*C09K 13/02* (2006.01)
*H01L 29/786* (2006.01)
(Continued)

(52) U.S. Cl.
CPC ............ *C09K 13/02* (2013.01); *C09K 13/00* (2013.01); *H01L 21/30604* (2013.01); *H01L 21/30608* (2013.01); *H01L 21/31111* (2013.01); *H01L 21/823412* (2013.01); *H01L 21/823431* (2013.01); *H01L 21/823437* (2013.01); *H01L 29/42392* (2013.01); *H01L 29/66742* (2013.01); *H01L 29/78684* (2013.01); *H01L 29/78696* (2013.01)

(58) Field of Classification Search
None
See application file for complete search history.

(56) References Cited

U.S. PATENT DOCUMENTS 5,417,877 A * 5/1995 Ward .................... C09D 9/005
134/38
2002/0077259 A1* 6/2002 Skee .................. C11D 11/0047
510/175

(Continued)

FOREIGN PATENT DOCUMENTS

EP 3 040 397 7/2016
TW 200724649 7/2007

OTHER PUBLICATIONS

Loup, V., et al., "Si and SiGe Alloys Wet Etching Using TMAH Chemistry," ECS Transactions, vol. 58, No. 6, Aug. 31, 2013, pp. 47-55.

*Primary Examiner* — Roberts P Culbert (57) ABSTRACT

Etching compositions suitable for the selective removal of silicon over silicon-germanium from a microelectronic device comprising: water; at least one of a quaternary ammonium hydroxide compound and an amine compound; water-miscible solvent; optionally surfactant and optionally corrosion inhibitor; and the method of using the etching composition for the selective removal.

19 Claims, 1 Drawing Sheet

(51) Int. Cl.
*H01L 29/423* (2006.01)
*H01L 21/306* (2006.01)
*H01L 29/66* (2006.01)
*C09K 13/00* (2006.01)
*H01L 21/311* (2006.01)
*H01L 21/8234* (2006.01)

(56) References Cited

U.S. PATENT DOCUMENTS

| | | |
|---|---|---|
| 2005/0239672 A1 | 10/2005 | Mun et al. |
| 2010/0056410 A1 | 3/2010 | Visintin et al. |
| 2010/0248495 A1 | 9/2010 | Yaguchi |
| 2011/0104875 A1 | 5/2011 | Wojtczak et al. |
| 2012/0319168 A1 | 12/2012 | Liu et al. |
| 2013/0119013 A1 | 5/2013 | Matsui et al. |
| 2014/0134778 A1 | 5/2014 | Ferstl |
| 2016/0064243 A1 | 3/2016 | Gawase et al. |
| 2016/0186058 A1* | 6/2016 | Parris .................... C09K 13/02 216/18 |
| 2017/0145311 A1* | 5/2017 | Liu ........................ C09K 13/00 |

* cited by examiner

ETCHING SOLUTION FOR SELECTIVELY REMOVING SILICON OVER SILICON-GERMANIUM ALLOY FROM A SILICON-GERMANIUM/ SILICON STACK DURING MANUFACTURE OF A SEMICONDUCTOR DEVICE

CROSS REFERENCE TO RELATED APPLICATIONS

This application claims priority to U.S. provisional application 62/550,491 filed on Aug. 25, 2017, the entire contents of which is incorporated herein by reference thereto for all allowable purposes.

BACKGROUND OF THE INVENTION

The present invention relates to aqueous etching solutions used in the manufacture of semiconductor devices. More specifically, the invention provides an aqueous etching solution that exhibits increased etch selectivity of silicon over silicon-germanium alloy in silicon-germanium/silicon composite semiconductor devices.

With constant down-scaling and increasingly demanding requirements to the speed and functionality of ultra-high density integrated circuits, conventional planar metal-oxide-semiconductor field effect transistors (MOSFETs) face increasing challenges with such issues as scaling of gate oxide thickness and electrostatic control of the gate electrode over the channel region. Fin field effect transistors (FinFETs) have exhibited improved control over a planar gate MOSFET design by wrapping the gate electrode over three sides of a fin-shaped channel.

GAA MOSFETs are similar to FinFETs but have the potential of even greater electrostatic control over the channel because the gate electrode completely surrounds the channel. In a GAA MOSFET, the channel region is essentially a nanowire. The nanowire channel typically has a thickness (or diameter) in the tens of nanometers (nm) or less and has an unconstrained length. The nanowire channel is suspended generally horizontally between, and anchored to, the much larger source and drain regions of the GAA MOSFET.

GAA MOSFETs can be fabricated on a bulk silicon substrate utilizing fully compatible CMOS technology. A typical manufacturing method of forming the channel regions in a GAA MOSFET involves epitaxially growing a stack (epi-stack) of sacrificial layers sandwiched between channel layers on top of a bulk substrate. The sacrificial layers and channel layers are composed of two different materials so that selective etching can remove the sacrificial layers.

By way of example, an epi-stack can be formed of alternating silicon (Si) and silicon germanium alloy (SiGe) layers, wherein the Si layers are the sacrificial layers and the SiGe layers are the channel layers. The Si layers can then be removed by selective etching (for example via a wet etching process such as a TMAH), which also inadvertently recesses trenches into the bulk substrate due to the similarity of materials composing the sacrificial layers and the substrate. The SiGe layers can subsequently be formed into the nanowire channels suspended over the trenches. A thin gate dielectric is then disposed around the SiGe nanowire channels and over the recessed trenches of the substrate. Metal is then disposed over the dielectric to form the metal gate electrode of the GAA MOSFET.

A number of alkaline etchants have been reported for wet etching silicon, TMAH and ammonium hydroxide are the most commonly used silicon etchants due to their known high selectivity between Si and $SiO_2$, however, when employed in a process to selectively etch silicon over SiGe, these etchants suffer from low horizontal etching power in releasing Si from SiGe/Si stack.

For next generation devices, particularly on GAA device fabrication, the channel length is targeted to be about 5~10 nm thus the etching rate control for a silicon sacrificial layer to yield SiGe nanowire protection is very important. If the formulation cannot give high etching selectivity, then the result will be either an incompletely etched sacrificial layer (Si) release or SiGe nanowire damage.

Accordingly, there is a need in the art for a silicon etchant composition and method for using the composition in forming, for example, nanowire channels in GAA MOSFETs, which provides better control of the etching process during removal of sacrificial layers with little or no trench formation or damage to the nanowire structure.

BRIEF SUMMARY OF THE INVENTION

In one aspect, the present invention provides an etching solution suitable for the selective removal of silicon over silicon-germanium from a microelectronic device, which comprises water; at least one of a quaternary ammonium hydroxide compound and an amine compound; water-miscible solvent; optionally surfactant; and optionally corrosion inhibitor.

In another aspect, the present invention provides methods of selectively enhancing the etch rate of silicon relative to silicon germanium on a microelectronic device (composite semiconductor device) comprising silicon and silicon-germanium, the method comprising the steps of: contacting the microelectronic device (composite semiconductor device) comprising silicon and silicon-germanium with an aqueous composition comprising water; at least one of a quaternary ammonium hydroxide compound and an amine compound; water-miscible solvent; optionally surfactant; and optionally corrosion inhibitor; and rinsing the composite semiconductor device after the silicon is at least partially removed, wherein the selectivity of the etch for silicon over silicon-germanium is greater than about 50, or greater than 70, or greater than 90. Additionally in some embodiments, the etch rate of SiGe is preferably less than 15 Å/min or 12 Å/min or 10 Å/min or less than 5 Å/min. The method conditions, such as time and temperature, may be increased or decreased to modify the selectivity and removal rates. The contacting step may use any of the compositions of this invention.

The embodiments of the invention can be used alone or in combinations with each other.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of silicon over silicon-germanium from a microelectronic device having such material(s) thereon during its manufacture.

It will be understood that the term "silicon" as deposited as a material on a microelectronic device will include polysilicon.

For ease of reference, "microelectronic device" or "semiconductor device" corresponds to semiconductor substrates, for example wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

A "composite semiconductor device" or "composite microelectronic device" means that the device has more than one materials and/or layers and/or portions of layers present on a non-conductive substrate. The materials may comprise high K dielectrics, and/or low K dielectrics and/or barrier materials and/or capping materials and/or metal layers and/or others known to persons of skill.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-K dielectric material" refers to a material with a high dielectric constant κ (as compared to silicon dioxide). High-κ dielectrics may be used to replace a silicon dioxide gate dielectric or another dielectric layer of a microelectronic device. The high-k material may be hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), or platinum zirconium titanium (PZT).

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%.

In the broad practice of this aspect, the etching solution of the present development comprises, consists essentially of, or consists of water; at least one of a quaternary ammonium hydroxide compound and an amine compound; a water-miscible solvent; and optionally, a surfactant.

In some embodiments, the etching solution compositions disclosed herein are formulated to be substantially free or free of at least one of the following chemical compounds: TMAH, ammonium hydroxide, and any source of fluoride ions.

The compositions of the present invention are suitable for use in a process for making a gate all around structure on an electronic device. Such processes are known in the art such as, for example, the process disclosed in U.S. patent application Publication No. 2017/0179248, U.S. patent application Publication No. 2017/0104062, U.S. patent application Publication No. 2017/0133462, and U.S. patent application Publication No. 2017/0040321, the disclosures of which are incorporated herein by reference.

The headings employed herein are not intended to be limiting; rather, they are included for organizational purposes only.

The compositions disclosed herein exhibit excellent silicon removal preferentially over silicon-germanium.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water. The ranges of water described in the next paragraph include all of the water in the composition from any source.

It is believed that, for most applications, the weight percent of water in the composition will be present in a range with start and end points selected from the following group of numbers: 0.5, 1, 5, 10, 15, 17, 20, 23, 25, 30, 35, 40, 45, 50, 55, 60, 65 and 70. Examples of the ranges of water that may be used in the composition include, for examples, from about 0.5% to about 60% by wt., or 1% to about 60% by wt. of water; or from about 0.5% to about 40% by wt., or from about 1% to about 25% by wt., or from about 1% to about 20% by wt., or from about 1% to about 15% by wt.; or from about 5% to about 20% by wt.; or from 5% to about 15% by wt. or from 20% to about 60% by wt., or from 25% to about 60% by wt. or from about 30% to about 60% by wt., or from about 35% to about 55% by wt. of water. Still other preferred embodiments of the present invention may include water in an amount to achieve the desired weight percent of the other ingredients.

Si Etchant

The etching compositions of the present invention comprise silicon etchant that is at least one of quaternary ammonium hydroxide and amine compound. In some embodiments, the silicon etchant comprises both a quaternary ammonium hydroxide and an amine compound.

The quaternary ammonium hydroxide may be a quaternary ammonium hydroxide in which all of the alkyl groups are the same, such as, tetramethylammonium hydroxide, tetraethylammonium hydroxide, and/or tetrabutylammonium hydroxide and so on.

Alternatively and preferred are quaternary ammonium hydroxides including tetraalkylammonium hydroxides wherein not all of the alkyl groups are the same. Examples of tetraalkylammonium hydroxides wherein not all of the alkyl groups are the same include the group consisting of benzyltrimethyl ammonium hydroxide, ethyltrimethyl ammonium hydroxide (ETMAH), 2-hydroxyethyltrimethyl ammonium hydroxide, benzyltriethyl ammonium hydroxide, hexadecyltrimethyl ammonium hydroxide, methyltriethylammonium hydroxide and mixtures thereof.

It is believed that the amount of the quaternary ammonium hydroxide compound in the composition will, for the most applications, comprise weight percents within a range having start and end points selected from the following group of numbers: 0.5, 1, 2, 3, 5, 7, 8, 10, 12, 15, 20, 25, 30 and 35. Examples of ranges of quaternary ammonium hydroxide in the compositions of this invention may be from about 1% to about 35% by weight of the composition, specifically, about 8% to about 35% by weight of the composition, or more specifically, about 20% to about 35% by weight of the composition. By way of example, if the quaternary ammonium hydroxide compound is an ETMAH (20% solution), then if added at 25% by weight, there will be 5% active quaternary ammonium hydroxide compound. In some embodiments, the quaternary ammonium hydroxide compound (on a neat basis) comprises comprise weight percents within a range having start and end points selected from the following group of numbers: 0.1, 0.5, 1, 2, 3, 4, 5, 7, 8, 9, 10, 11, 12, 14, 15, 17, 20, 25, 30 and 35. Examples of ranges of quaternary ammonium hydroxide (neat) in the compositions of this invention may be from about 2% to about 15% weight percent and, more specifically, from about 3 to about 12% or from about from 3 to about 7%, from about 1 to about 10% or from about 1 to about 12% or from about 1 to about 7% or from about 0.5 to about 7% by weight of the composition.

Regarding the quaternary ammonium hydroxide, the etching compositions disclosed herein may be substantially free of or free of ammonium hydroxide and tetramethylammonium hydroxide (TMAH), and may be substantially free of or free of all tetraalkyl ammonium hydroxides wherein the alkyl groups are all the same.

Suitable amine compounds include at least one alkanolamine. Preferred alkanolamines include the lower alkanolamines which are primary, secondary and tertiary having from 1 to 5 carbon atoms. Examples of such alkanolamines include N-methylethanolamine (NMEA), monoethanolamine (MEA), diethanolamine, mono-, di- and tri-isopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of triethanolamine (TEA), diethanolamine, N-methyl diethanolamine, diisopropanolamine, monoethanol amine, amino (ethoxy) ethanol (AEE), N-methyl ethanol amine, monoisopropanol amine, cyclohexylaminediethanol, and mixtures thereof.

It is believed that the amount of the amine compound in the composition will, for the most applications, comprise weight percents within a range having start and end points selected from the following group of numbers: 0.5, 1, 2, 3, 5, 7, 8, 10, 12, 15, 20, 25, 30, 35, 40, 45, 50, 55, 60, 65 and 70. Examples of ranges of amine compound in the compositions of this invention may be comprise from about 1% to about 50% by weight of the composition, specifically, about 8% to about 50% by weight of the composition, or more specifically, about 20% to about 50% by weight of the composition. In some embodiments, the amine compound comprises from about 20% to about 65% weight percent and, more specifically, from about 10 to about 60%, or from about 150 to about 55% or from about 20 to about 50% or from about 1 to about 12% or from about 25 to about 45% or from about 30 to about 40% by weight of the composition.

The amine compound, if employed in excess may also serve as the base component of a buffer if a corresponding conjugate acid is employed such as, for example, a polyfunctional organic acid. Alternatively, the compositions of this invention may be substantially free of or free of added polyfunctional acids and/or inorganic acids and/or organic acids. Additionally, the compositions of this invention may be substantially free or free of any of the above-listed individual alkanolamines alone or in any combination.

Alternatively, in other embodiments, the compositions of this invention may be free of or substantially free of amines other than alkanolamines.

Water-Miscible Solvent

The etching compositions of the present invention comprise a water-miscible solvent. Examples of water-miscible organic solvents that can be employed are ethylene glycol, propylene glycol, 1,4-butanediol, tripropylene glycol methyl ether, propylene glycol propyl ether, diethylene gycol n-butyl ether (BDG) (e.g., commercially available under the trade designation Dowanol DB), dipropylene glycol methyl ether (DPM) hexyloxypropylamine, poly(oxyethylene)diamine, dimethylsulfoxide (DMSO), tetrahydrofurfuryl alcohol, glycerol, alcohols, sulfolane, sulfoxides, or mixtures thereof. Preferred solvents are alcohols, diols, or mixtures thereof. Most preferred solvents are polyols including diols, such as, for example, propylene glycol and triols, such as, for example, glycerol.

It is believed that, for most applications, the amount of water-miscible organic solvent in the composition may be in a range having start and end points selected from the following list of weight percents: 0.5, 1, 5, 7, 10, 12, 15, 20, 25, 29, 30, 33, 35, 40, 44, 50, 59.5. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 20% by weight; or from about 7% to about 20%, or from about 10% to about 30% by weight; or from about 15% to about 25% by weight of the composition.

Surfactants (Optional)

The etching compositions of the present invention optionally comprise at least one surfactant. The surfactant functions to protect the silicon-germanium from etching. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid and dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31 R1, Pluronic L61, Pluronic F-127) (Dynol 607), polyoxypropylene sucrose ether (SN0085, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel). In some embodiments, cationic surfactants, for examples, bromide-containing surfactants, such as, 1-hexadecyltrimethylammonium bromide are preferred.

In some embodiments, the cationic surfactant, if employed, comprises polyalkyleneimine. The polyalkyleneimine is a polyethyleneimine (PEI). Any PEI may be used, but a homopolymeric polyethyleneimine may be employed. The PEI may be branched or linear. PEI may have any formula weight for effectiveness, or a lower formula weight (FW), such as a FW between 100 and 50,000, between 400 and 25,000, between 800 and 10,000, or between 1000 and 3000.

In an embodiment, the composition may comprise polyalkyleneimine e.g. polyethyleneimine (PEI) and the PEI may comprises less than 1% by weight of the composition, or less than 0.5% by weight, or from about 0.02% to 1% by weight of the composition. The PEI may have a molecular weight (FW) between 100 and 2500, or 200 and 1500, or 400 and 1200. The polyalkyleneimine may have a molecular weight between 100 and 2500, between 200 and 1500, between 400 and 1200, or between 700 and 900. A molecular weight of 800 is particularly suitable. The molecular weight is suitably determined by light scattering techniques known in the art. Polyethyleneimines are commercially available, for example Lupasol® 800 which is supplied by BASF.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

When present, the amount of surfactant may be in a range from about 0.001 wt % to about 1 wt %, or from about 0.01 to about 1 wt %, or about 0.1 wt % to about 1 wt %, based on the total weight of the composition. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.05 wt. % to about 2 wt. %, or about 0.5 wt. % to about 5 wt. % of the composition. In alternative embodiments the weight percent of surfactant in the composition, based on the total weight of the composition may be within any range having start and end points selected from the following: 0.001, 0.01, 0.05, 0.1, 0.5, 1, 2, 4, 5, 8, 10 and 15.

In some embodiments the compositions of this invention will be free of or substantially free of any or all of the above-listed surfactants.

Corrosion Inhibitors (Optional)

The etching composition of the present invention may also include one or more of the corrosion inhibitors. The corrosion inhibitors, if present, may protect the silicon-germanium from etching. Examples of corrosion inhibitors include amino carboxylic acids, for example, triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl) ethylenediaminetriacetic acid (HEDTA), and nitrotriacetic acid (NTA), aminophosphonic acids, such as, N,N,N',N'-ethylenediaminetetra(methylenephosphonic) acid (EDTMP); carboxylic acids, such as, decanoic acid, citric acid, tartaric acid, gluconic acid, saccharic acid, glyceric acid, oxalic acid, ascorbic acid, phthalic acid, benzoic acid, mercaptobenzoic acid, maleic acid, mandelic acid, malonic acid, lactic acid and salicylic acid. Other possible corrosion inhibitors include propyl gallate, pyrogallol, quinolines, such as, 8-hydroxyquinoline, piperazines, such as, 1-(2-aminoethyl)piperazine, cysteine, and N,N,N',N'',N'''-pentamethyldiethylenetriamine (Polycat 5). Another corrosion inhibitors may include hexylamine. Some preferred corrosion inhibitors may comprise sulfur-containing groups. Other preferred corrosion inhibitors may comprise aminocarboxylic acids such as EDTA, CyDTA, quinolines, such as, 8-hydroxyquinoline, decanoic acid, 11-mercaptoundecanoic acid, piperazines, such as, 1-(2-aminoethyl)piperazine, benzimidazoles, such as, 2-mercapto-5-methylbenzimidizole, and carboxylic acids, such as, oxalic acid, decanoic acid, and ascorbic acid. More preferred corrosion inhibitors include decanoic acid, ascorbic acid, 11-mercaptoundecanoic acid, 1-(2-aminoethyl)piperazine, and 8-hydroxyquinoline. Most preferred is 8-hydroxyquinoline.

It is believed that, for most applications, the amount of the corrosion inhibitors, such as, amino carboxylic acids, carboxylic acids, quinolines, or piperazines, etc, in the composition may be in a range having start and end points selected from the following list of weight percents: 0.01, 0.05, 0.07, 0.1, 0.12, 0.15, 0.17, 0.2, 0.5, 1, 1.2, 1.5, 1.7, 2, 3, 4, 6, 8, 10, 12, 15. By way of example, the corrosion inhibitors may be present in the composition from about 0.05 wt % to about 3 wt %, or from about 0.01 to about 3 wt %, or about 0.1 wt % to about 5 wt %, or from about 0.1 wt. % to about 15 wt. %; or from about 0.1 wt. % to about 10 wt. %, or from about 0.5 wt. % to about 5 wt. %, or from about 0.05 wt. % to about 2 wt. %, or about 0.5 wt. % to about 5 wt. % based on the total weight of the composition.

In some embodiments the compositions of this invention will be free of or substantially free of any or all of the above-listed corrosion inhibitors, that is, the composition is free of any or all of the above-listed aminocarboxylic acids and/or carboxylic acids and/or quinolines and/or piperazines, etc.

Other commonly known components such as dyes, chemical modifiers, biocides etc. can be included in the cleaning composition in conventional amounts, for example, amounts up to a total of about 1 or 5 or 10 weight % of the composition to the extent that they do not adversely affect the performance of the composition.

Alternatively, the compositions of this invention may be free or substantially free of any or all of dyes, chemical modifiers, or biocides.

In some embodiments, the etching solution compositions disclosed herein are formulated to be substantially free or free of fluorides and/or quaternary ammonium fluorides, for examples the composition may be substantially free or free of one or more of the following: tetramethylammonium fluoride, tetraethylammonium fluoride, methyltriethylammonium fluoride, and/or tetrabutylammonium fluoride. In some embodiments, the composition may be substantially free of or free of one or more metal hydroxides, such as KOH or LiOH or NaOH. In other embodiments, the composition may be substantially free of or free of a halide-containing compound, for example it may be substantially free or free of one or more of the following: fluorine-, bromine-, chlorine- or iodine-containing compounds. In other embodiments, the composition may be substantially free or free of sulfonic acid and/or sulfuric acid and/or nitric acid and/or hydrochloric acid and/or phosphoric acids. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or sulfur-containing compounds. In other embodiments, the compositions of the present invention may be substantially free or free of oxidizing agents such as, for example, peroxide compounds such as, for example, hydrogen peroxide, persulfates (e.g., monopersulfates and/or dipersulfates), percarbonates and/or acids thereof and/or salts thereof and/or mixtures thereof. In other embodiments, compositions of the present invention may be substantially free or free of one or more oxidizing agents, such as, for example, oxidized halides (e.g., iodates, periodates, and/or acids thereof, and/or mixtures thereof), perboric acid, perborates, percarbonates, peroxyacids (e.g., peracetic acid, perbenzoic acid, salts thereof, permanganates, cerium compounds and/or ferricyanides (e.g., potassium ferricyanide).

The etching solution composition of the present invention is typically prepared by mixing the components together in a vessel at room temperature until all solids have dissolved in the aqueous-based medium.

Examples of some embodiments of this invention will comprise from about 30% to about 70% by wt., or from about 30% to about 60% by wt., or from about 35% to about 55% by wt. water; from about 15% to about 55% by wt., or 20% to about 50% by wt., or from about 25% to about 45% by wt. of at least one of a quaternary ammonium hydroxide compound and an amine compound; from about 10% to about 50% by wt., or from about 20% to about 40% by wt., or from about 25% to about 35% by wt. water-miscible solvent; optionally from about 0.05 to about 5% by wt. surfactant; and optionally from about 0.05 to about 5% by wt. corrosion inhibitor. Alternative ranges of the components are described above, as well as, the ranges for the quaternary ammonium hydroxide compound and/or the amine compound in any combination of those ranges as if they were all set forth here.

Method

In another aspect there is provided a method for selectively enhancing the etch rate of silicon relative to silicon-germanium in a microelectronic device e.g. composite semiconductor device comprising silicon and silicon-germanium by etching the microelectronic device (composite semiconductor device) in a composition comprising, consisting essentially of, or consisting of water; at least one of a quaternary ammonium hydroxide compound and an amine compound; a water-miscible solvent; and optionally, a surfactant. The method comprises the steps of selectively enhancing the etch rate of silicon relative to silicon-germanium on a microelectronic device (composite semiconductor device) comprising silicon and silicon-germanium, the method comprising the steps of: contacting the microelectronic device (composite semiconductor device) comprising silicon and silicon-germanium with an aqueous composition comprising water; at least one of a quaternary ammonium hydroxide compound and an amine compound; a water-miscible solvent; and optionally, a surfactant; and rinsing the composite semiconductor device after the silicon is at least partially removed, wherein the selectivity of the etch for silicon over silicon-germanium is greater than about 50. An additional drying step may also be included in the method. "At least partially removed" means removal of at least 50% of the material, preferably at least 70% removal, most preferably, at least 80% removal using the compositions of the present invention in the method of this invention.

To realize the nanowire fabrication for GAA devices, etch rate selectivity on Si/Si/SiGe is preferable greater than (>) 50, SiN etch is preferably less than (<) 10 or less than 5 Å/min and thermal oxide etch is preferably less than (<) 2 or less than 1 Å/min.

The sacrificial silicon is preferably in a (110) orientation.

The contacting step can be carried out by any suitable means such as, for example, immersion, spray, or via a single wafer process. The temperature of the composition during the contacting step is preferably from about 25 to 100° C. and more preferably from about 40 to 75° C. The contact time may be from about 1 to 60 minutes.

Compositions of the present invention surprisingly exhibit excellent etch selectivity for silicon over silicon-germanium when used on substrates that include silicon and silicon-germanium such as, for example, during the manufacture of a stacked gate all around device. The term "selectivity" is typically used to refer to a ratio of etch rates of two materials. Compositions according to the present invention preferably exhibit a wet etch selectivity for silicon over silicon-germanium between from about 50 to about 500. In other embodiments, the etch selectivity for silicon over silicon-germanium observed with the composition of the present invention is between from about 50 to about 200.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water followed by the other components in no particular order.

Compositions of the Substrate

Figure 1:
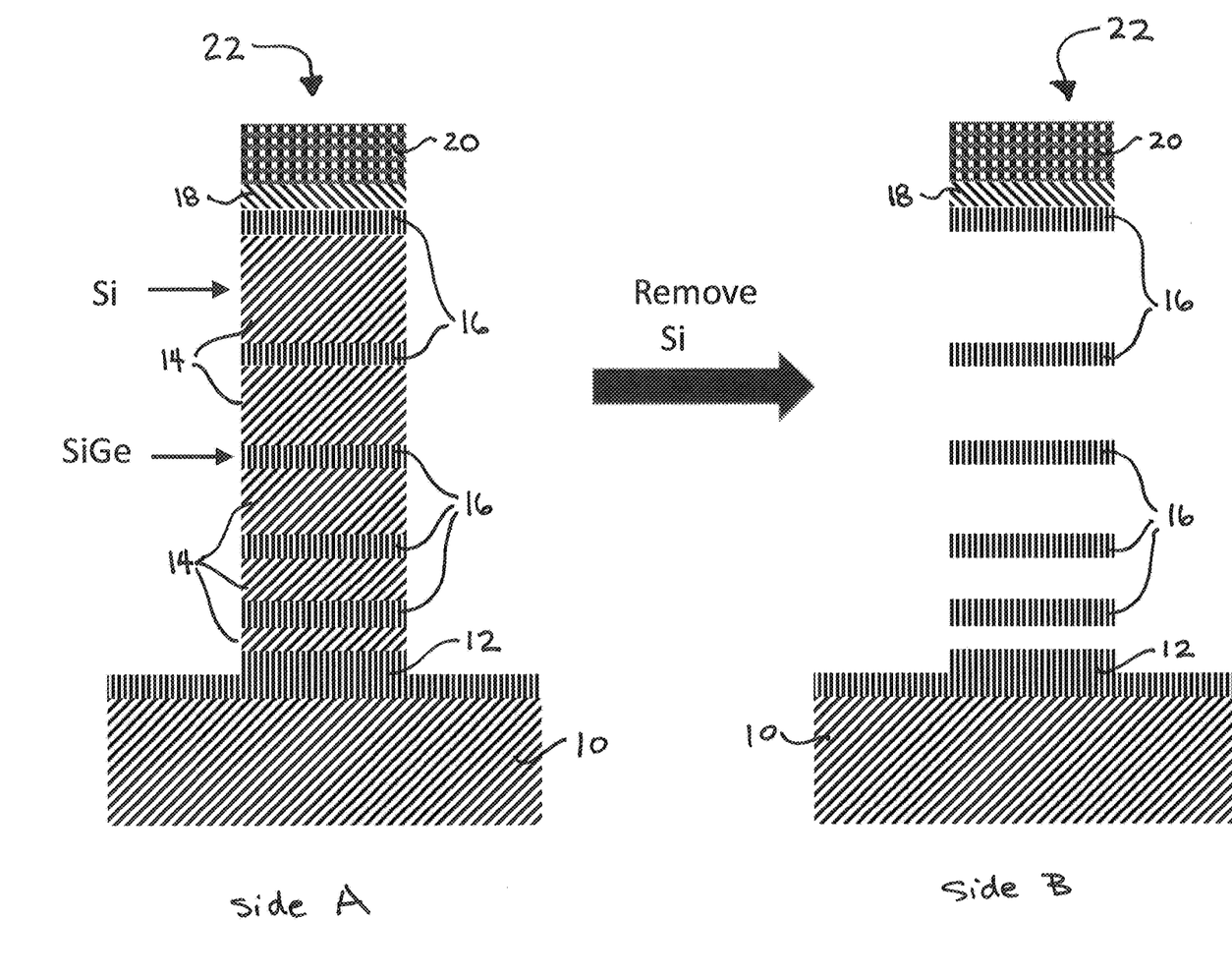
FIG. 1 is a schematic of a portion of microelectronic device prior to and after etching with the compositions and methods of this invention to selectively remove the silicon (structures, layers or films) from the device.

SiGe/Si multilayers were deposited by hetero-epitaxy on Si wafer. Side A of FIG. 1 shows a schematic of the microelectronic device treated in the examples. The SiGe/Si multilayer deposition started with a thick SiGe layer 12 on the Si substrate 10. Then followed by a Si/SiGe multilayer deposition. (The Si layers are labeled 14. The SiGe layers are labeled 16.) An oxide layer 18 and nitride hard mask (HM) layer 20 were deposited on top of the multilayer and patterned into parallel FINs 22. The SiGe/Si nanowire FINs were etched selectively and resulted in SiGe nanowire. Side A of FIG. 1 shows the microelectronic device treated in the examples before contacting the device with the compositions of this invention. Side B of Figure shows the microelectronic device after treatment.

Processing Conditions

Etching tests were run using 100 g of the etching compositions in a 250 ml beaker with a ½" round Teflon stir bar set at 400 rpm. The etching compositions were heated to a temperature of about 45° C. on a hot plate. The test coupons were immersed in the compositions for about 20 minutes while stirring.

The segments were then rinsed for 3 minutes in a DI water bath or spray and subsequently dried using filtered nitrogen. The silicon and silicon-germanium etch rates were estimated from changes in the thickness before and after etching and was measured by spectroscopic ellipsometry (MG-1000, Nano-View Co., Ltd., South Korea we use SCI FilmTek SE2000). Typical starting layer thickness was 1000 Å for Si and 1000 Å for SiGe.

Example Set 1

Example 1: Solvent Effect

As detailed in the compositions of Table 2, different solvents were evaluated to determine their effect on etching and selectivity.

TABLE 1

Solvent Effect on Poly Si/SiGe Etching Selectivity

|  | 294F | 294C | 294E | 294G | 294I | 294D | 294H |
|---|---|---|---|---|---|---|---|
| ETMAH (20%) | 15 | 15 | 15 | 15 | 15 | 15 | 15 |
| DIW | 39.7 | 39.7 | 39.7 | 39.7 | 39.7 | 39.7 | 39.7 |
| AEE | 25 | 25 | 25 | 25 | 25 | 25 | 25 |
| Lupasol 800 | 0.3 | | | | | | |
| Glycerol | 20 | | | | | | |
| DMSO | | 20 | | | | | |
| PG | | | 20 | | | | |
| DPM | | | | 20 | | | |
| DIW sulfolane | | | | | 20 | | |
| | | | | | | 20 | |
| BDG | | | | | | | 20 |
| poly Si e/r at 45° C. | 150.3 | 145.2 | 123.2 | 90.5 | 220 | 133 | 84.6 |
| SiGe e/r at 45° C. | 16.6 | 17.4 | 17.8 | 14.4 | 35 | 27.6 | 25.2 |
| Poly Si/SiGe selectivity | 9.1 | 8.3 | 6.9 | 6.3 | 6.3 | 4.8 | 3.4 |

This set of experiments revealed that glycerol, DPM, PG, and DMSO appeared to be beneficial in terms of silicon etch selectivity over SiGe.

Example 2: Suppression of SiGe Etch

Corrosion inhibitors of various functionalities were evaluated for their protection of SiGe nanowire from being etched in an alkaline environment. SiGe damage occurs easily in conventional Si etchant especially when Ge concentration is near, at or below 25% by moles in the SiGe alloy. Tables 3 to 6 summarize the compositions evaluated.

TABLE 2

Carboxylic Acid Functional Groups/Corrosion Inhibitors

|  | e21334-243I | e21334-254A | e21334-254X | e21334-254Y | e42807-010A | e42807-010B |
|---|---|---|---|---|---|---|
| ETMAH (20%) | 15.0 | 15.0 | 15.0 | 15.0 | 15.0 | 15.0 |
| DIW | 40.0 | 39.8 | 39.0 | 39.0 | 39.0 | 39.0 |
| AEE | 25.0 | 25.0 | 25.0 | 25.0 | 25.0 | 25.0 |
| Glycerol | 20.0 | 20.0 | 20.0 | 20.0 | 20.0 | 20.0 |
| decanoic acid | | 0.2 | | | | |
| benzoic acid | | | 1.0 | | | |
| ascorbic acid | | | | 1.0 | | |
| oxalic acid | | | | | 1.0 | |
| salicylic acid | | | | | | 1.0 |
| SiGe(25%) e/r at 40° C. | 12.6 | 8.1 | 12.4 | 4.0 | 9.6 | 11.4 |

TABLE 3

Amino Functional Groups/Corrosion Inhibitors/Surfactants

|  | e21334-243I | e21334-254K | e21334-254O | e21334-254Q | e21334-254P |
|---|---|---|---|---|---|
| ETMAH (20%) | 15 | 15 | 15 | 15 | 15 |
| DIW | 40 | 39 | 39.7 | 39.5 | 39 |
| AEE | 25 | 25 | 25 | 25 | 25 |
| Glycerol | 20 | 20 | 20 | 20 | 20 |
| poly cat 5 | | 1.0 | | | |
| lupasol 800 | | | 0.3 | | |
| 1-(2-aminoethyl)piperazine 99% | | | | 0.5 | |
| Hexylamine | | | | | 1.0 |
| SiGe (25%) e/r at 40° C. | 12.6 | 14.5 | 11.2 | 7.8 | 10.2 |

TABLE 4

Surfactant Effect

|  | e21334-243I | e21334-254R | e21334-254S |
|---|---|---|---|
| ETMAH (20%) | 15 | 15 | 15 |
| DIW | 40 | 40 | 39.5 |
| AEE | 25 | 25 | 25 |
| Glycerol | 20 | 20 | 20 |
| (1-hexadecyl)trimethyl-ammonium bromide 98% | | 0.2 | |
| Dynol 607 | | | 0.5 |
| SiGe (25%) e/r at 40° C. | 12.6 | 7.8 | 11.3 |

TABLE 5 other Corrosion Inhibitors

|  | e21334-288F | e42807-009Z | e42807-010S | e42807-010T | e42807-010K |
|---|---|---|---|---|---|
| DIW | 20.0 | 20.0 | 20.0 | 20.0 | 20.0 |
| ETMAH (20%) | 25.0 | 25.0 | 25.0 | 25.0 | 25.0 |
| AEE | 35.0 | 34.0 | 34.0 | 34.0 | 34.0 |
| Glycerol | 20.0 | 20.0 | 20.0 | 20.0 | 20.0 |
| 8-hydroxyquinoline | | 1.0 | | | |
| 11-mercaptoundecanoic acid | | | 0.9 | | |
| 4-mercaptobenzoic acid | | | | 1.0 | |
| 2-mercapto-5-methylbenzimidazole | | | | | 1.0 |
| SiGe (25%) e/r at 40° C. | 8.6 | 5.8 | 1.3 | 9.3 | 9.8 |

These experiments suggest that there are benefits when the following compounds are employed in the silicon etching compositions: decanoic acid, ascorbic acid, 1-(2-aminoethyl)piperazine, (1-hexadecyl)trimethyl-ammonium bromide, 8-hydroxyquinoline and 11-mercaptoundecanoic acid.

Example 3

The following formulation was further evaluated:

|  | e42807-009Z |
|---|---|
| DIW | 20.0 |
| ETMAH (20%) | 25.0 |
| AEE | 34.0 |
| Glycerol | 20.0 |
| 8-hydroxylquinoline | 1.0 |
| SiGe e/r at 40° C. | 5.76 |
| poly Si e/r at 40° C. | 570.62 |
| Poly Si/SiGe selectivity | 99.1 |

This composition exhibited a poly-Si/SiGe selectivity of 99 and was found to completely release Si layers on patterned wafer. SiGe nanowire was thus successfully fabricated at 40° C./3 min. In addition, this composition also exhibited good stability at 45° C. for 120 hrs, which enables it to be operated in a recirculation mode. See Tables 7 and 8.

TABLE 6

| Temp (° C.) | SiGe (25%) | Si (100) | Si (110) | Si (111) | Poly Si | SiN (500 A) | SiN (200 A) | thermal oxide |
|---|---|---|---|---|---|---|---|---|
| 40 | 5.8 | 637 | 723 | 238 | 570.6 | 0.4 | 0.1 | 0.2 |
| 45 | 7.9 | 1034 | 1199 | 384 | n.a | 0.5 | 0.2 | 0.2 |
| 55 | 11.5 | 1988 | 2204 | 771 | n.a | n.a | n.a | n.a |

Etch Rate

TABLE 7

Selectivity

| Temp (° C.) | Si (110)/ Si (100) | Si (111)/ Si (100) | Si (100)/ SiGe (25%) | Si (110)/ SiGe (25%) | Si (111)/ SiFe (25%) |
|---|---|---|---|---|---|
| 40 | 1.14 | 0.37 | 110.59 | 125.52 | 41.32 |
| 45 | 1.16 | 0.37 | 130.95 | 151.72 | 48.67 |
| 55 | 1.11 | 0.39 | 172.85 | 191.69 | 67.04 |

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of silicon over silicon-germanium from a microelectronic device, which comprises:
    about 30% to about 70% by weight of water;
    about 15% to about 55% by weight of at least one of a quaternary ammonium hydroxide compound and an amine compound;
    about 10% to about 50% by weight of a water-miscible solvent;
    about 0.5% to about 5% by weight of a corrosion inhibitor; and
    optionally surfactant,
    wherein the corrosion inhibitor is selected from the group of 8-hydroxyquinoline and 11-mercaptoundecanoic acid.

2. The etching solution of claim 1, wherein the quaternary ammonium hydroxide compound and the amine compound are present.

3. The etching solution of claim 2, wherein the quaternary ammonium hydroxide compound is a tetraalkylammonium hydroxide compound wherein not all of the alkyl groups are the same; and the amine compound is an alkanolamine.

4. The etching solution of claim 3, wherein the quaternary ammonium hydroxide compound is selected from the group consisting of benzyltrimethyl ammonium hydroxide, methyltriethylammonium hydroxide ethyltrimethyl ammonium hydroxide (ETMAH), 2-hydroxyethyltrimethyl ammonium hydroxide, benzyltriethyl ammonium hydroxide, hexadecyltrimethyl ammonium hydroxide, and mixtures thereof; and
    the alkanolamine compound is selected from the group consisting of N-methylethanolamine (NMEA), monoethanolamine (MEA), diethanolamine, triethanolamine, triisopropanolamine, 2-(2-aminoethylamino)ethanol, 2-(2-aminoethoxy)ethanol (AEE), triethanolamine, N-ethyl ethanolamine, N,N-dimethylethanolamine, N,N-diethyl ethanolamine, N-methyl diethanolamine, N-ethyl diethanolamine, cyclohexylaminediethanol, diisopropanolamine, cyclohexylaminediethanol, and mixtures thereof.

5. The etching composition of claim 4, wherein the quaternary ammonium hydroxide compound is ethyltrimethyl ammonium hydroxide (ETMAH); and the alkanolamine is amino(ethoxy) ethanol (AEE).

6. The etching composition of claim wherein the water-miscible solvent is selected from the group consisting of ethylene glycol, propylene glycol, 1,4-butanediol, tripropylene glycol methyl ether, propylene glycol propyl ether, diethylene gycol n-butyl ether, hexyloxypropylamine, poly(oxyethylene)diamine, dimethylsulfoxide, tetrahydrofurfuryl alcohol, glycerol, alcohols, sulfoxides, or mixtures thereof.

7. The etching composition of claim 6, wherein the water-miscible solvent is glycerol.

8. The etching composition of claim 1, wherein the surfactant is present.

9. The etching composition of claim 8, wherein the surfactant is a polyalkyleneimine.

10. The etching composition of claim wherein the corrosion inhibitor is present.

11. A method of selectively enhancing the etch rate of silicon relative to silicon-germanium on a microelectronic device comprising silicon and silicon-germanium, the method comprising the steps of:
    contacting the microelectronic device comprising silicon and silicon-germanium with the etching composition of claim 1; and
    rinsing the microelectronic device after the silicon is at least partially removed, wherein the selectivity of the etch for silicon over silicon-germanium is greater than about 50.

12. The method of claim 11 further comprising the step of drying the semiconductor device.

13. The method of claims 11, wherein the selectivity of the etch for silicon over silicon-germanium is between about 50 and about 500.

14. The method of claim 11, wherein the contacting step is performed at a temperature of from about 25° C. to about 100° C.

15. The method of claim 11, wherein the quaternary ammonium hydroxide compound and the amine compound are present.

16. The method of claim 15, wherein the quaternary ammonium hydroxide compound is a tetraalkylammonium hydroxide compound wherein not all of the alkyl groups are the same; and the amine compound is an alkanolamine.

17. The method of claim 16, wherein the quaternary ammonium hydroxide compound is selected from the group consisting of benzyltrimethyl ammonium hydroxide, methyltriethylammonium hydroxide, ethyltrimethyl ammonium hydroxide (ETMAH), 2-hydroxyethyltrimethyl ammonium hydroxide, benzyltriethyl ammonium hydroxide, hexadecyltrimethyl ammonium hydroxide, and mixtures thereof; and
    the alkanolamine compound is selected from the group consisting of N-methylethanolamine (NMEA), monoethanolamine (MEA), diethanolamine, triethanolamine, triisopropanolamine, 2-(2-aminoethylamino)ethanol, 2-(2-aminoethoxy)ethanol (AEE), triethanolamine, N-ethyl ethanolamine, N,N-dimethylethanolamine, N,N-diethyl ethanolamine, N-methyl diethanolamine, N-ethyl diethanolamine, cyclohexylaminediethanol, diisopropanolamine, cyclohexylaminediethanol, and mixtures thereof.

18. The method of claim 17, wherein the quaternary ammonium hydroxide compound is ethyltrimethyl ammonium hydroxide (ETMAH); and the alkanolamine is amino (ethoxy) ethanol (AEE).

19. The method of claim any of claims 11, wherein the water-miscible solvent is selected from the group consisting of ethylene glycol, propylene glycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof.

* * * * *